United States Patent
Miura

[11] Patent Number: 5,597,610
[45] Date of Patent: Jan. 28, 1997

[54] METHOD FOR COATING ELECTRIC COMPONENT WITH RESIN

[75] Inventor: Satoshi Miura, Nagaokakyo, Japan

[73] Assignee: Murata Manufacturing Co., Ltd., Japan

[21] Appl. No.: 479,847

[22] Filed: Jun. 7, 1995

Related U.S. Application Data

[63] Continuation of Ser. No. 240,919, May 10, 1994, abandoned.

[30] Foreign Application Priority Data

May 11, 1993 [JP] Japan ..................... 5-109090

[51] Int. Cl.$^6$ ............. B05D 5/12; H04R 17/00; H01L 41/04
[52] U.S. Cl. ............. 427/58; 427/100; 427/407.2; 427/430.1; 29/25.35; 310/340
[58] Field of Search ............. 427/58, 96, 100, 427/407.2, 430.1; 29/25.35; 310/340

[56] References Cited

U.S. PATENT DOCUMENTS

| | | | |
|---|---|---|---|
| 3,900,596 | 8/1975 | Lee | 427/58 |
| 4,039,904 | 8/1977 | Klein et al. | 361/433 |
| 4,273,803 | 6/1981 | Jöhnk | 427/58 |
| 4,307,129 | 12/1981 | Nisigahana | 427/58 |
| 4,351,880 | 9/1982 | Fukut et al. | 428/378 |
| 4,406,059 | 9/1983 | Scott et al. | 29/857 |
| 4,708,885 | 11/1987 | Saito et al. | 427/58 |
| 5,108,299 | 4/1992 | Cronin | 439/188 |

FOREIGN PATENT DOCUMENTS

| | | | |
|---|---|---|---|
| 118626 | 5/1987 | Japan . | |
| 248213 | 10/1988 | Japan . | |
| 2274009 | 11/1990 | Japan . | |
| 61411 | 2/1992 | Japan | 427/100 |

Primary Examiner—Shrive Beck
Assistant Examiner—Brian K. Talbot
Attorney, Agent, or Firm—Ostrolenk, Faber, Gerb & Soffen, LLP

[57] ABSTRACT

An electric component includes an electric element and terminals connected and fixed with the electric element. The electric element and parts of the terminals are covered with a coating resin. A method for covering the electric component with the resin comprises a step of coating a repelling material for repelling a releasing agent on the terminals above a standard line which is the lowest limit of parts on the terminals that are planned to be covered with the coating resin, a step of coating a releasing agent for repelling the resin on the terminals below the standard line on the terminals, the releasing agent being repelled by the repelling material, and a step of coating the resin on the electric element from the standard line on the terminals by dipping the electric element into a melted resin.

7 Claims, 1 Drawing Sheet

METHOD FOR COATING ELECTRIC COMPONENT WITH RESIN

This is a continuation of application Ser. No. 08/240,919 now abandoned, filed on May 10, 1994.

BACKGROUND OF THE INVENTION

1. Field of the Invention

The present invention relates to a method for covering an electric component with a resin, more particularly, to a method for covering an electric element and parts of terminals of said electric component with a coating resin.

2. Description of the Prior Art

Generally, there is an electric component wherein an electric element is covered with a coating resin. As reasons for covering the electric element with the coating resin, the following are given.

The first reason is for protecting the electric element against an impact applied to a surface part thereof. If not covered with the coating resin, when an impact is applied to the electric element, the electric component element may be broken or chipped, and it is likely to become a source of trouble. Thus, by covering with the coating resin, an impact applied to the electric element is cushioned.

The second reason is for protecting the electric element against moisture, dust and the like. If not covered with the coating resin, moisture, dust and the like in the air maybe stuck on the electric element, and it is likely to deteriorate the characteristic of the electric element. Thus, the electric element is covered with the coating resin so as not to allow moisture, dust and the like in the air to stick on the electric element.

As a material of the coating resin, a resin such as epoxy resin or the like is used.

After connecting and fixing the electric element with terminals, the electric element and parts of the terminals are dipped into a melted resin, the resin is stuck on them, and the resin is hardened, whereby the electric element is covered with the coating resin.

When the electric component is covered with the coating resin, the electric component is deeply dipped into the melted resin so as to cover the electric element with the coating resin completely. Thus, when the electric element is regarded as an upper part of the electric component, there is a case wherein lower parts below the predetermined positions on the terminals are covered with the coating resin. In this case, with the coating resin stuck on the lower parts, holes for receiving the terminals formed at a substrate for mounting the electric component may become filled, which is likely to cause poor soldering.

Therefore, conventionally, when the electric element is regarded as an upper part of the electric component, the lowest limit of the planned parts to be covered with the coating resin on the terminals is regarded as a standard line, and a releasing agent is coated on lower parts below the standard line so as not to allow the coating to stick on the parts coated with the releasing agent on the terminals, whereby the positions covered with the coating resin on the terminals are adjusted.

However, in the conventional method for covering the electric component with the resin, when the terminals are coated with the releasing agent, it is possible for the releasing agent to be stuck on the terminals, on the side toward the electric element, over the standard line which is the lowest limit of the planned parts to be covered with the coating resin on the terminals, by spreading of the releasing agent or the like. When the electric component having the releasing agent stuck on the terminals over the standard line is covered with the coating resin by dipping into a resin such as a melted epoxy resin, the lowest limit of the parts covered with the coating resin on the terminals is too close to the electric element rather than being at the standard line, so that an amount of the stuck resin decreases as compared with the predetermined amount. Since the strength of the coating resin is proportional to the amount of the stuck resin, the strength of the coating resin of the electric component decreases as compared with the predetermined strength. Thus, by an impact applied from the outside thereof, it is likely to break the coating resin and to deteriorate the airtightness of the electric component.

Also, when decreasing the strength of the coating resin, it is likely that the electric element is not entirely protected by the coating resin against an impact applied from the outside, it is likely that the electric element is broken or chipped.

Furthermore, when breaking the coating resin and deteriorating the airtightness of the electric component, it is likely that moisture, dust and the like are stuck on the electric element and the characteristic of the electric element is deteriorated. Also, in an electric component such a piezo-electric vibrating component or the like, when deteriorating the airtightness, it is likely to cause troubles that the resonance frequency is shifted, a desirable characteristic is not obtained and so on.

SUMMARY OF THE INVENTION

Therefore, it is a primary object of the present invention to provide a method for covering an electric component with a resin wherein a coating resin of an electric component can be prevented from deteriorating the strength and the airtightness thereof.

The present invention relates to a method for covering an electric component with a resin wherein an electric element and parts of terminals connected and fixed with the electric element are covered with a coating resin comprising a step of coating a repelling material on the terminals for repelling a releasing agent on the electric element side from a standard line which is a limit of planned parts to be covered with the coating resin on the terminals, a step of coating a releasing agent on the terminals for repelling the resin on the opposite side of the electric element from the standard line, and a step of coating the resin on the electric element from the standard line on the terminals.

In the present invention, since the repelling material for repelling the releasing agent is coated on the side of the terminals toward the electric element from the standard line which is the limit of the planned parts to be covered with the coating resin on the terminals, the releasing agent can be prevented from sticking on the planned parts to be covered with the coating resin over the standard line.

According to the present invention, since the releasing agent can be prevented from sticking on the planned parts to be covered with the coating resin on the electric element side from the standard line on the terminals, the determined positions of the terminals are covered with the coating resin, the coating resin can be prevented from deteriorating the strength and the airtightness thereof. Thus, the electric component can be certainly protected against an impact applied to a surface part of the electric component, moisture and so on.

Furthermore, since the releasing agent can be stuck on the predetermined positions, when the electric component element is dipped into a resin such as a melted epoxy resin for covering with the coating resin, an amount of the stuck coating resin can be freely adjusted.

The above and other objects, features, aspects and advantages of the present invention will become more apparent from the following detailed description of the embodiment with reference to the accompanying drawing.

DESCRIPTION OF THE PREFERRED EMBODIMENT

Figure 1:
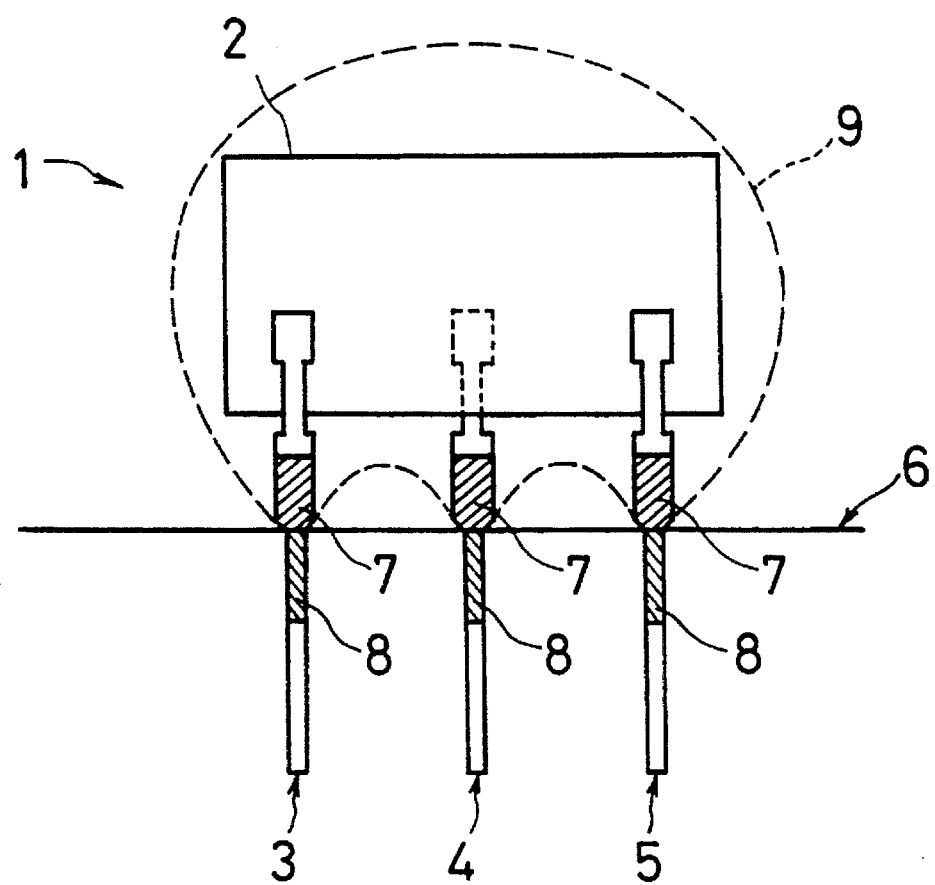
FIG. 1 is a front view showing one embodiment of the present invention.

An electric 1 includes an electric element 2 and terminals 3, 4 and 5. The electric element 2 is held so as to put between the terminals 3, 4 and 5. The terminals 3, 4 and 5 are connected and fixed to electrodes (not shown) of the electric element 2 by means of soldering or the like. The electric element 2 and parts of the terminals 3, 4 and 5 are covered with a coating resin 9.

A method for covering the electric component 1 with the coating resin 9 will be explained as follows.

Firstly, as shown in FIG. 1, when the electric element 2 is regarded as an upper part of the electric component 1, the lowest limit of the planned parts to be covered with the coating resin 9 on the terminals 3, 4 and 5 is regarded as a standard line 6. A repelling material 7 such as polyesteramide resin, silicon or epoxy resin for repelling a releasing agent is coated on upper parts of the terminals above the standard line 6, that is, on parts of the terminals above the standard line 6 on the side toward the electric element 2.

Then, a releasing agent 8 consisting of fluorocarbon is coated on parts of the terminals 3, 4 and 5 extending from the standard line 6 in the opposite direction, away from the electric element 2.

After, the electric element 2 is held with the terminals 3, 4 and 5 and is dipped into a melted epoxy resin in a downward state, the epoxy resin is stuck on the electric element 2 and so on.

Then, by heating and hardening the stuck epoxy resin, the electric element 2 and so on are covered with the coating resin 9.

According to the embodiment, when the releasing agent 8 is coated on the terminals 3, 4 and 5, even if the releasing agent 8 is spread on the upper parts of the terminals toward the electric element 2 over the standard line 6 by mistake, since the releasing agent 8 is repelled by the repelling material 7 coated on the terminals above the standard line 6 and extending toward the electric element 2, the releasing agent 8 can be prevented from sticking on the terminals over the standard line 6.

Also, since the releasing agent 8 consisting of fluorocarbon is coated on the parts of the terminals 3, 4 and that extend from the standard line 6 and away from the electric element 2, when the electric component 1 is covered with the coating resin 9, even if the electric element 2 is deeply dipped into the melted resin in a downward state, since the releasing agent 8 repels the coating resin 9, the coating resin 9 can be certainly prevented from sticking below the standard line 6 on the terminals 3, 4 and 5

Thus, the predetermined positions of the electric element 2 and the terminals 3, 4 and 5 are covered with the coating resin 9, the coating resin 9 can be prevented from deteriorating the strength and the airtightness thereof. Therefore, the electric element 2 can be certainly protected against an impact applied to the electric component 1, moisture and so on.

Furthermore, since the releasing agent 8 can be stuck on the predetermined positions, when the electric element 2 is dipped into the melted epoxy resin for covering with the coating resin 9, an amount of the stuck coating resin 9 can be freely adjusted.

Though fluorocarbon is used as a material of the releasing agent in the abovementioned embodiment, a material that repels a resin used as a material of the coating resin may be used as a material of the releasing agent. That is, a material of the releasing agent is changed depending on a resin used as a material of the coating resin.

Though polyesteramide resin, silicon or epoxy resin is used as a material of the repelling material for repelling the releasing agent in the abovementioned embodiment, a material of the repelling material may be a material which can repel the releasing agent and can not repel the resin used as the coating resin. That is, a material of the repelling material for repelling the releasing agent is changed depending on materials of the releasing agent and the coating resin.

It will be apparent from the foregoing that, while the present invention has been described in detail and illustrated, these are only particular illustrations and examples and the present invention is not limited to these. The spirit and scope of the present invention is limited only by the appended claims.

What is claimed is:

1. A method for covering an electric component with a resin wherein an electric element and parts of terminals connected and fixed with said electric element are covered with a coating resin, comprising the steps of:

coating a repelling material, which is effective for repelling a releasing agent but which is not effective for repelling said resin, on a part of said terminals on one side of a standard line which is a limit of planned parts of said terminals to be covered with said coating resin, coating a releasing agent which is effective for repelling said resin on a part of said terminals on the opposite side of said standard line, and coating said coating resin on said electric element from said standard line on said terminals, said coating step including exposing said electric element and said parts of said terminals on which said repelling material and said releasing agent are coated to said resin, and releasing the resin which contacts the parts where said releasing agent is coated, so that said electric element and said parts of said terminals on said one side of said standard line are coated with said coating resin.

2. A method for covering an electric component with a resin according to claim 1, wherein said step of coating said resin includes the step of dipping said electric element into melted resin.

3. A method for covering an electric component with a resin in accordance with claim 1, wherein said coating resin is a melted epoxy resin.

4. A method for covering an electric component with a resin in accordance with claim 1, wherein said repelling material is selected from the group consisting of polyesteramide resin, silicon and epoxy resin.

5. A method for covering an electric component with a resin in accordance with claim 1, wherein said releasing agent is a fluorocarbon which is effectively repelled by said repelling material and is effective for repelling said coating resin.

6. A method for covering an electric component with a resin in accordance with claim 4, wherein said coating resin is a melted epoxy resin.

7. A method for covering an electric component with a resin in accordance with claim 5, wherein said coating resin is a melted epoxy resin.

* * * * *